US012684217B2

(12) United States Patent
Wu

(10) Patent No.: US 12,684,217 B2
(45) Date of Patent: Jul. 14, 2026

(54) ENDOSCOPIC LIGHT SOURCE-IMAGING MODULE

(71) Applicant: Medimaging Integrated Solution, Inc., Hsinchu (TW)

(72) Inventor: Shangyi Wu, Hsinchu (TW)

(73) Assignee: MEDIMAGING INTEGRATED SOLUTION, INC., Hsinchu (TW)

( * ) Notice: Subject to any disclaimer, the term of this patent is extended or adjusted under 35 U.S.C. 154(b) by 69 days.

(21) Appl. No.: 18/671,165

(22) Filed: May 22, 2024

(65) Prior Publication Data

US 2024/0397182 A1 Nov. 28, 2024

(30) Foreign Application Priority Data

May 23, 2023 (TW) .................................. 112205134

(51) Int. Cl.
| | |
|---|---|
| *H04N 23/50* | (2023.01) |
| *H04N 23/56* | (2023.01) |
| *H04N 23/57* | (2023.01) |
| *H10W 90/00* | (2026.01) |

(52) U.S. Cl.
CPC ........... *H04N 23/555* (2023.01); *H04N 23/56* (2023.01); *H04N 23/57* (2023.01); *H10W 90/00* (2026.01)

(58) Field of Classification Search
CPC ...... H04N 23/555; H04N 23/56; H04N 23/57; H01L 25/167
See application file for complete search history.

(56) References Cited

U.S. PATENT DOCUMENTS

| | | | |
|---|---|---|---|
| 9,571,748 B1 * | 2/2017 | Bostick ................... | F21V 14/02 |
| 11,309,299 B2 * | 4/2022 | Wu ......................... | H10W 90/00 |
| 12,064,090 B2 * | 8/2024 | Chen .................. | A61B 1/00096 |
| 2015/0014717 A1 * | 1/2015 | Park ................... | H10H 20/8583 |
| | | | 257/89 |
| 2018/0144174 A1 * | 5/2018 | Tzu ........................ | H10F 39/804 |
| 2022/0265130 A1 * | 8/2022 | Wu ......................... | H10F 39/811 |

* cited by examiner

*Primary Examiner* — Richard A Hansell, Jr.
(74) *Attorney, Agent, or Firm* — MUNCY, GEISSLER, OLDS & LOWE, P.C.

(57) ABSTRACT

An endoscopic light source-imaging module including a substrate, an image sensor, and a light-emitting element is provided. The top surface of the substrate is provided with a cavity. The cavity has a first surface and a second surface neighboring each other and having a preset height drop therebetween. A first conductive route and a second conductive route of the substrate extend from the top surface penetrating through the substrate to a bottom surface. The image sensor is disposed on the first surface and is electrically connected to the first conductive route. The light-emitting element is disposed on the second surface, neighboring one side of the image sensor and electrically connected to the second conductive route. The present invention improves the image quality of the endoscope, reduces the module size, decreases the fabrication stages, increases the productivity, and lowers the cost.

12 Claims, 12 Drawing Sheets

100

41

42

100

ENDOSCOPIC LIGHT SOURCE-IMAGING MODULE

BACKGROUND OF THE INVENTION

1. Field of the Invention

The present invention relates to an imaging module, particularly to an endoscopic light source-imaging module.

2. Description of the Prior Art

In the conventional endoscopic optical module, CMOS image sensors (CIS), light-emitting diodes (LED) and transmission wires are soldered onto a printed circuit board (PCB) or a flexible printed circuit (FPC) board. Then, the planar PCB or FPC is bent to a predetermined angle. Alternatively, two pieces of PCBs or FPCs are soldered or assembled together to form the desired structure. However, the heights of CMOS image sensors (CIS) and light-emitting diodes (LED) are fixed. The relative distance thereof is unlikely to be adjusted. Thus, the parameters of light sources and illumination are hard to modify or optimize.

If no light-shielding material exists between the CMOS image sensors and the light-emitting diodes, the light from the light-emitting diodes may enter the CMOS image sensors to cause stray light issue, and the stray light may affect the images. Besides, shadows may appear if LEDs are disposed in too low position.

An upper cover may be used to shelter the CMOS image sensors, which are disposed on a flexible printed circuit board, to function as a light shielding layer. The flexible printed circuit board may be bent to adjust the position of LEDs. However, both solutions may enlarge the module size and impair assemblage/fabrication. In fabrication, resin needs filling into the gap between the CMOS image sensor and the upper cover to secure them. Therefore, a sufficient space should be preserved to allow the needle to reach deep for filling resin. Then, it will further enlarge the module size and impair the operation of small-size endoscopes. Suppose that the upper cover is used to protect the CMOS image sensor and the light-emitting dioses. The resin filling process needs performing many times to fix the upper cover and fill the gap between the cavity and the CMOS image sensors/the light-emitting diodes. Thus, the fabrication efficiency would be degraded.

Accordingly, the present invention proposes an endoscopic light source-imaging module to overcome the abovementioned conventional problems.

SUMMARY OF THE INVENTION

Considering the abovementioned problems, the primary objective of the present invention is to provide an endoscopic light source-imaging module, which can improve the image quality of endoscopes, facilitate module size reduction, decrease fabrication stages, increase productivity, and lower cost.

In order to achieve the abovementioned objective, the present invention provides an endoscopic light source-imaging module, which comprises a substrate, an image sensor, and a light-emitting element. The substrate includes a top surface, a bottom surface, a first conductive route, and a second conductive route. A cavity is provided on the top surface: the cavity has a first surface and a second surface. The first surface and the second surface neighbor each other and have a preset height drop therebetween. The first conductive route and the second conductive route extend from the top surface penetrating through the substrate to the bottom surface. The image sensor is disposed on the first surface and electrically connected with the first conductive route. The light-emitting element is disposed on the second surface, neighboring the image sensor and electrically connected with the second conductive route.

In some embodiments, a height of the first surface is less than a height of the second surface, and the height of the second surface is less than a height of the top surface.

In some embodiments, the height of the surface of the image sensor is higher than the height of the top surface of the light-emitting element.

In some embodiments, one end of the first conductive route has a first connection point, and the other end of the first conductive route has a second connection point. The first connection point is disposed on the first surface: the second connection point is disposed on the bottom surface. The second connection point is configured for an image signal output point of the image sensor.

In some embodiments, one end of the second conductive route has a third connection point, and the other end of the second conductive route has a fourth connection point. The third connection point is disposed on the second surface: the fourth connection point is disposed on the bottom surface. The fourth connection point is connected with an external power source to make the light-emitting element emit light.

In some embodiments, the endoscopic light source-imaging module of the present invention further comprises a filling material. The filling material is filled into the cavity to cover the first surface and the second surface of the cavity and is cured to form an encapsulation resin layer.

In some embodiments, the filling material may be an opaque resin material, and the height of the encapsulation resin layer is lower than or equal to the height of the top surface of the light-emitting element.

In some embodiments, the filling material may be a transparent resin material, and the height of the encapsulation resin layer is higher than the height of the top surface of the light-emitting element and lower than or equal to the height of the surface of the image sensor.

In some embodiments, the cavity has two second surfaces, and the endoscopic light source-imaging module has two light-emitting elements. The second surfaces are respectively arranged on two sides of the cavity. The region between the second surfaces sinks to form the first surface. The light-emitting elements are respectively arranged on the second surfaces.

In some embodiments, the substrate has a plurality of cavities, which are arranged in array. Each of the cavities has a first surface, a second surface, a first conductive route and a second conductive route.

In some embodiments, the endoscopic light source-imaging module of the present invention has a plurality of image sensors and a plurality of light-emitting elements. The number of the light-emitting elements is more than or equal to the number of the image sensors. The plurality of image sensors are respectively disposed on the first surfaces of the plurality of cavities: the plurality of light-emitting elements are respectively disposed on the second surface of the plurality of cavities: the substrate has a plurality of cut grooves between the plurality of cavities Therefore, the present invention can fabricate an endoscopic light source-imaging module, which outputs high-quality images, without using any extra fixture. In comparison with the conventional technology, the present invention can further reduce the module size. Furthermore, the present invention can provide modules having different sizes and different numbers of LED light sources.

The objective, technologies, features and advantages of the present invention will become apparent from the following description in conjunction with the accompanying drawings wherein certain embodiments of the present invention are set forth by way of illustration and example.

BRIEF DESCRIPTION OF THE DRAWINGS

The foregoing conceptions and their accompanying advantages of this invention will become more readily appreciated after being better understood by referring to the following detailed description, in conjunction with the accompanying drawings, wherein.

DESCRIPTION OF THE PREFERRED EMBODIMENTS

Figure 1A:
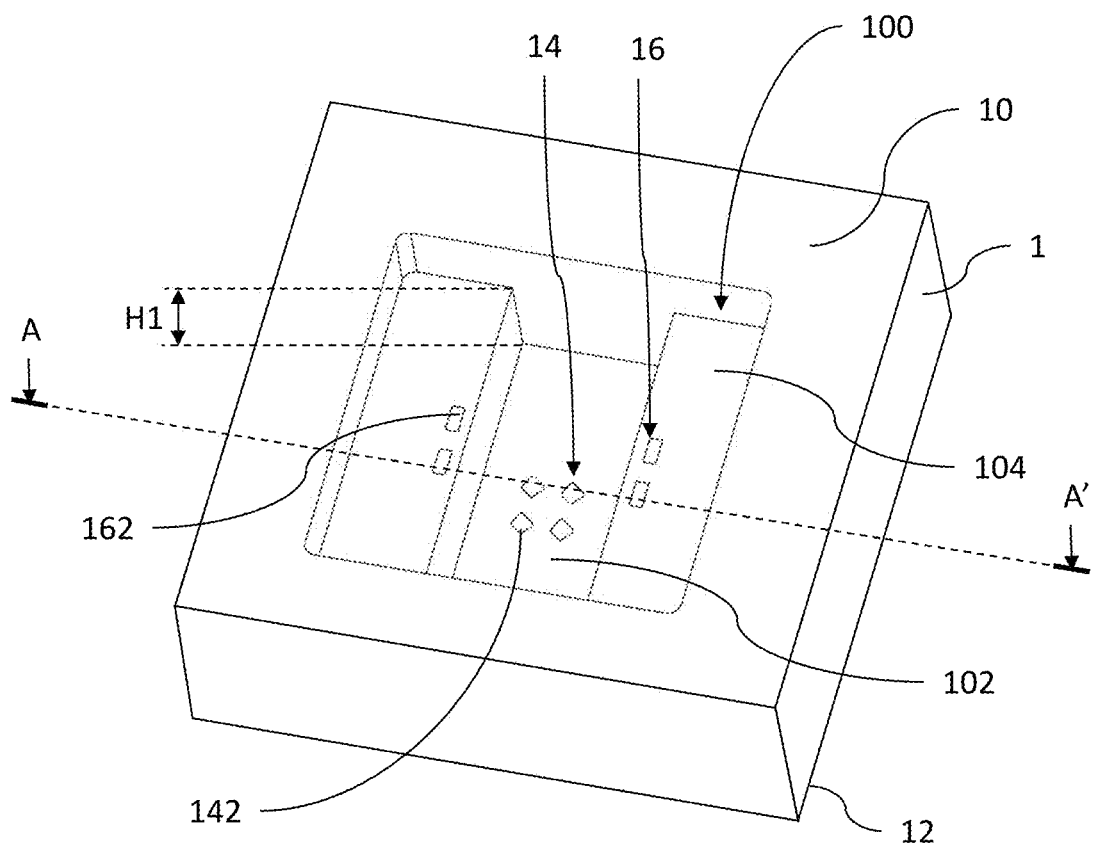
FIG. 1A is a perspective view schematically showing a substrate of an endoscopic light source-imaging module according to a first embodiment of the present invention.
Figure 1B:
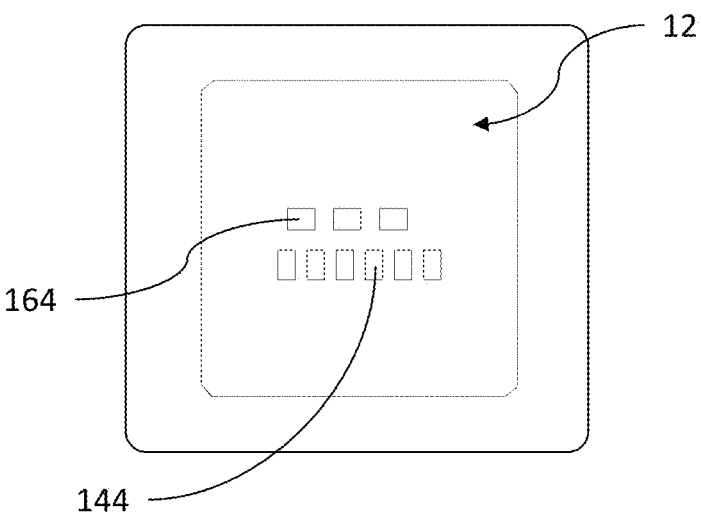
FIG. 1B is a diagram schematically showing a bottom surface of the substrate of the endoscopic light source-imaging module according to the first embodiment of the present invention.
Figure 1C:
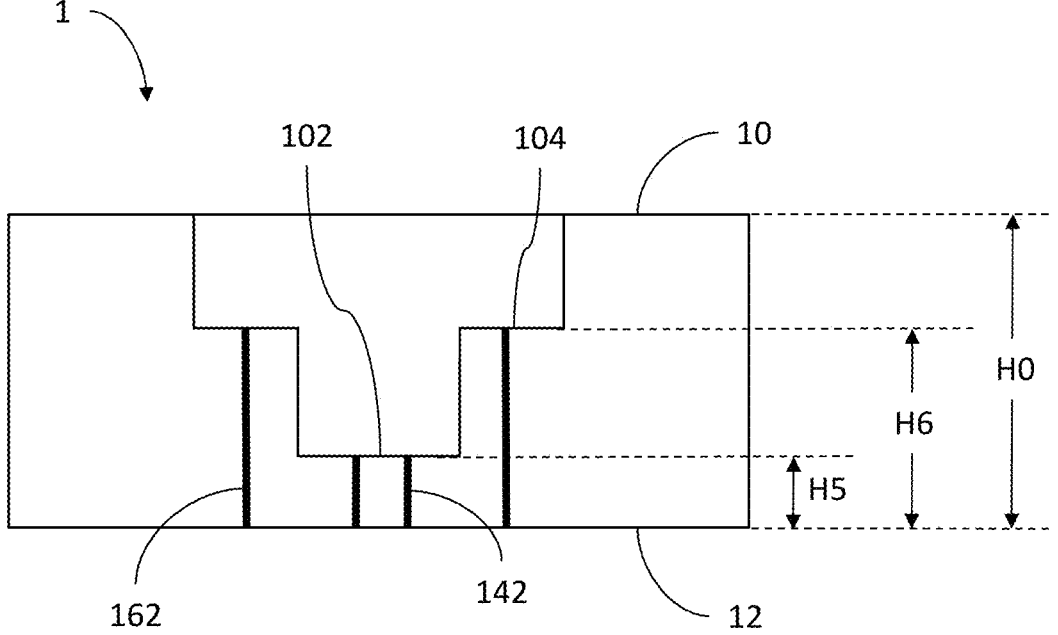
FIG. 1C is a sectional view taken along Line A-A' in FIG. 1A.
Figure 2A:
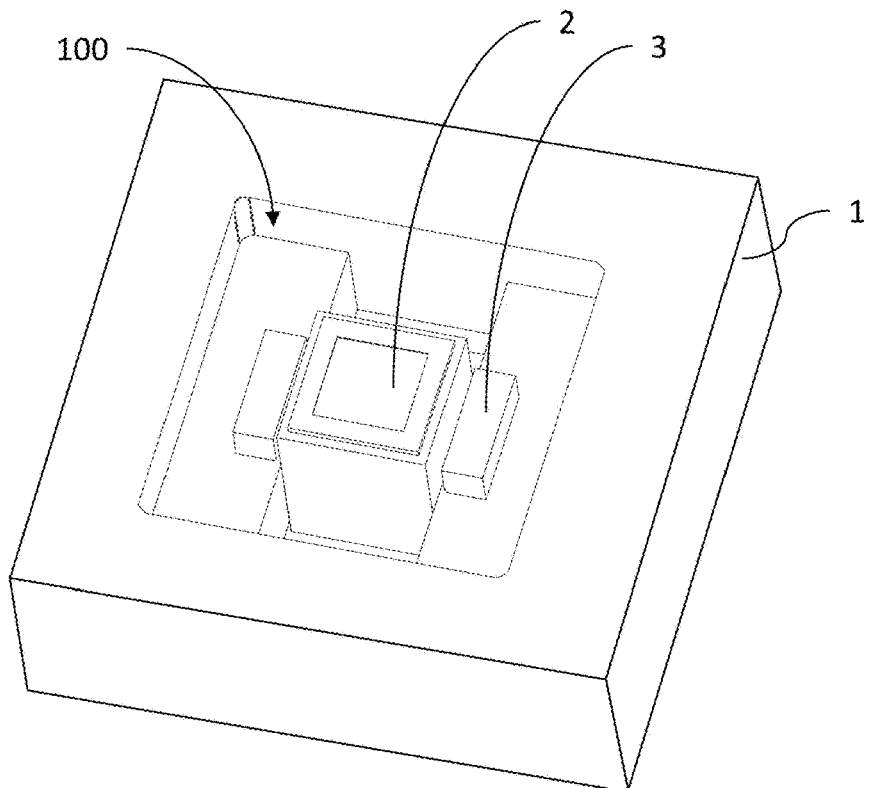
FIG. 2A is a perspective view schematically showing the endoscopic light source-imaging module where the filling material has not been filled yet according to the first embodiment of the present invention.
Figure 2B:
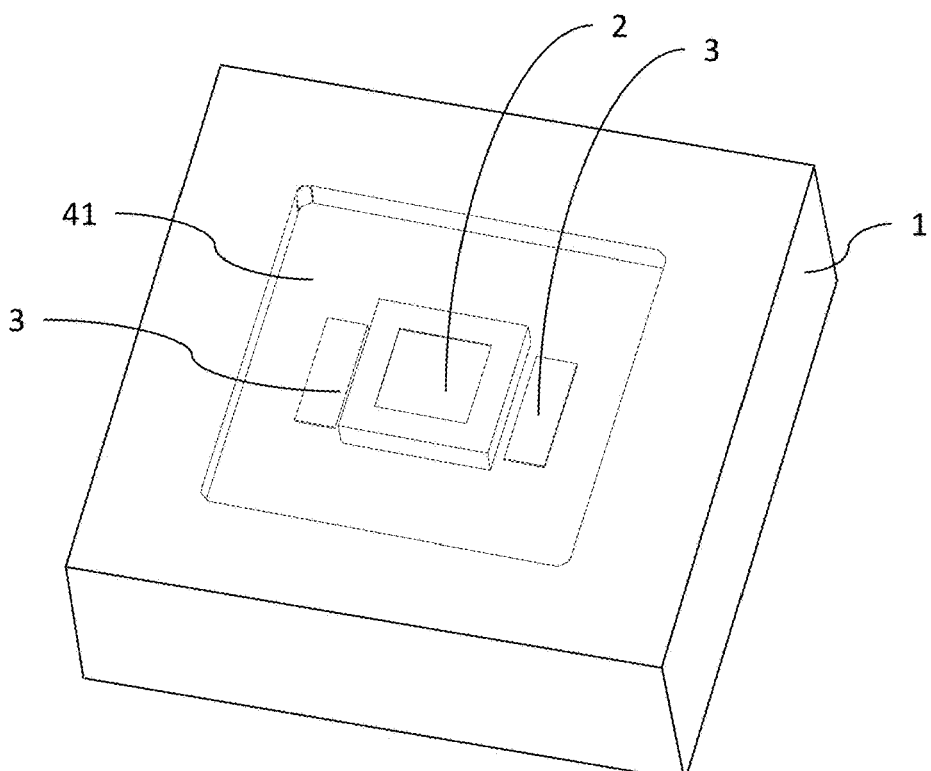
FIG. 2B is a perspective view schematically showing the endoscopic light source-imaging module where the filling material has been filled according to the first embodiment of the present invention.

The embodiments of the present invention will be further demonstrated in details hereinafter in cooperation with the corresponding drawings. In the drawings and the specification, the same numerals represent the same or the like elements as much as possible. For simplicity and convenient labelling, the shapes and thicknesses of the elements may be exaggerated in the drawings. It is easily understood: the elements belonging to the conventional technologies and well known by the persons skilled in the art may be not particularly depicted in the drawings or described in the specification. Various modifications and variations made by the persons skilled in the art according to the contents of the present invention are to be included by the scope of the present invention.

Refer to FIGS. 1A-1C, FIGS. 2A and 2B, and FIG. 3. In one embodiment, the endoscopic light source-imaging module A1 of the present invention comprises a substrate 1, an image sensor 2, and a light-emitting element 3. The substrate 1 includes a top surface 10, a bottom surface 12, at least one first conductive route 14, and at least one second conductive route 16. The top surface 10 has a cavity 100. The cavity 100 has a first surface 102 and a second surface 104. The first surface 102 and the second surface 104 neighbor each other and have a preset height drop H1 therebetween. The first conductive route 14 and the second conductive route 16 respectively extend from first surface 102 and a second surface 104 penetrating through the substrate 1 to the bottom surface 12. The image sensor 2 is disposed on the first surface 102 and electrically connected with the first conductive route 14. The light-emitting element 3 is disposed on the second surface 104, neighboring one side of the image sensor 2 and electrically connected with the second conductive route 16.

The height of the first surface is less than the height of the second surface, and the height of the second surface is less than the height of the top surface. That is to say, the heights of the top surface 10, the first surface 102 and the second surface 104 has the following relationship:

the height H5 of the first surface<the height H6 of the second surface<the height H0 of the top surface.

The height of the surface of the image sensor 2 is higher than the height of the top surface of the light-emitting element 3. In some embodiments, in order to provide higher image quality, the difference between the height of the surface of the image sensor 2 and the height of the top surface of the light-emitting element 3 is preferably smaller than or equal to 0.6 mm.

One end of the first conductive route 14 has a first connection point 142, and the other end of the first conductive route 14 has a second connection point 144. The first connection point 142 is disposed on the first surface 102: the second connection point 144 is disposed on the bottom surface 12. The second connection point 144 is the image signal output point of the image sensor 2.

One end of the second conductive route 16 has a third connection point 162, and the other end of the second conductive route 16 has a fourth connection point 164. The third connection point 162 is disposed on the second surface 104: the fourth connection point 164 is disposed on the bottom surface 12. The fourth connection point 164 is connected with an external power source to make the light-emitting element 3 emit light.

The endoscopic light source-imaging module A1 of the present invention further comprises a filling material 41. The filling material 41 is filled into the cavity 100 to cover the first surface 102 and the second surface 104 of the cavity 100 and is cured to form an encapsulation resin layer 4.

Figure 3:
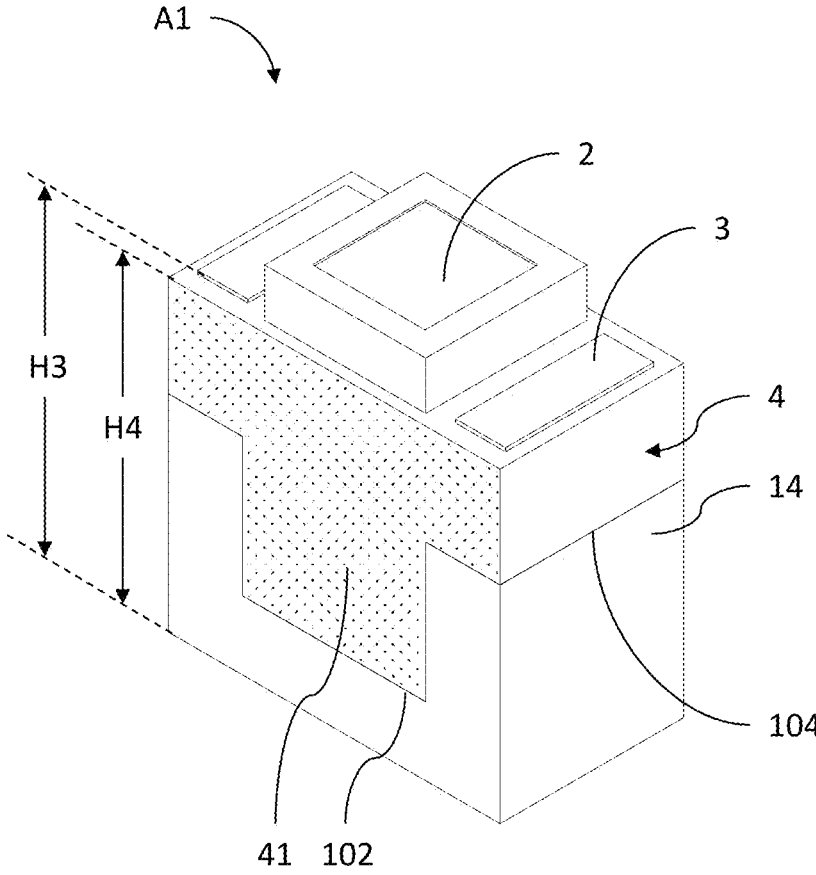
FIG. 3 is a sectional view schematically showing the endoscopic light source-imaging module according to the first embodiment of the present invention.

As shown in FIG. 3, in a first embodiment, the filling material 41 is an opaque resin material: the height H4 of the encapsulation resin layer 4 is lower than or equal to the height H3 of the top surface of the light-emitting element 3. In the first embodiment, the endoscopic light source-imaging module A1 has two second surfaces 104 and two light-emitting elements 3. Two second surfaces 104 are respectively arranged on two sides of the cavity 100. The region between two second surfaces 104 sinks to form the first surface 102. Two light-emitting elements 3 are respectively arranged on two second surfaces 104 and respectively disposed on two sides of the image sensor 2. The structures shown in FIG. 2B may be diced to form separated endoscopic light source-imaging modules A1.

The light-emitting elements 3 may be LEDs emitting lights of different colors or different wavelengths, such as white light LEDs, blue light LEDs, red light LEDs, green light LEDs, and infrared LEDs. The second surfaces 104 may have a plurality of light-emitting elements 3. The user may switch among or simultaneously turn on several LEDs for illumination or diagnostic inspection.

The height of the encapsulation resin, which is filled around the image sensor 2 and the light-emitting element 3, may be varied via changing the depth of the cavity 100 without installing extra fixtures around the image sensor 2 and the light-emitting element 3. An opaque resin having fluidity may be filled into the gap between the image sensor 2 and the light-emitting elements 3 to prevent the light leakage from sidewall surface of image sensor 2 by emitting elements 3. That is, the image quality can be approved without leakage light.

Figure 4:
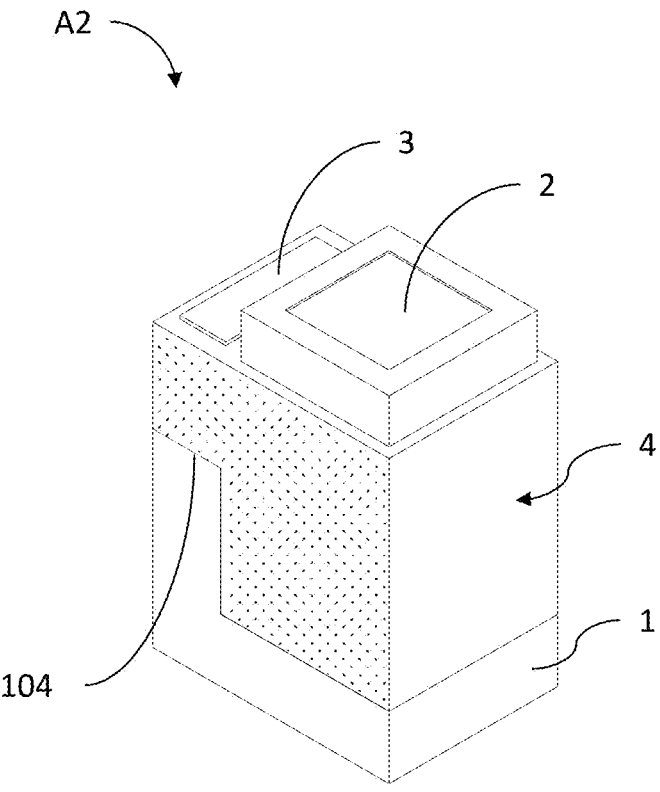
FIG. 4 is a sectional view schematically showing an endoscopic light source-imaging module according to a second embodiment of the present invention.

Refer to FIG. 4 for a second embodiment. The endoscopic light source-imaging module A2 of FIG. 4 is different from the endoscopic light source-imaging module A1 of FIG. 3 in that the endoscopic light source-imaging module A2 only has a single second surface 104 and a single light-emitting element 3. The single light-emitting element 3 is disposed on the single second surface 104.

Figure 5A:
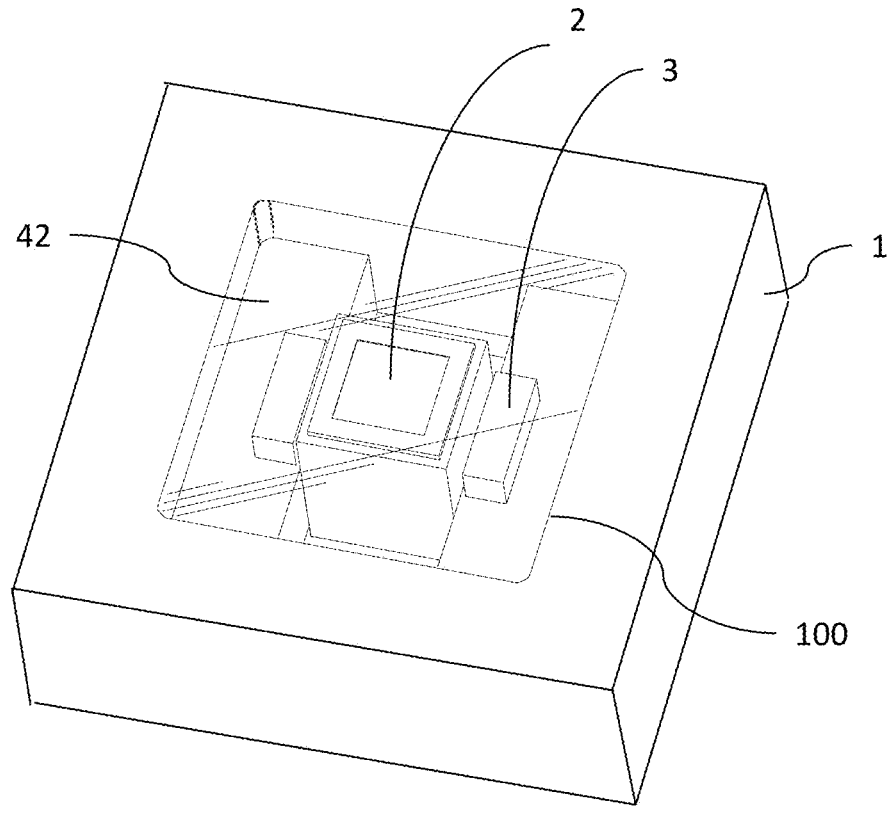
FIG. 5A is a perspective view schematically showing an endoscopic light source-imaging module where the filling material has been filled according to a third embodiment of the present invention.
Figure 5B:
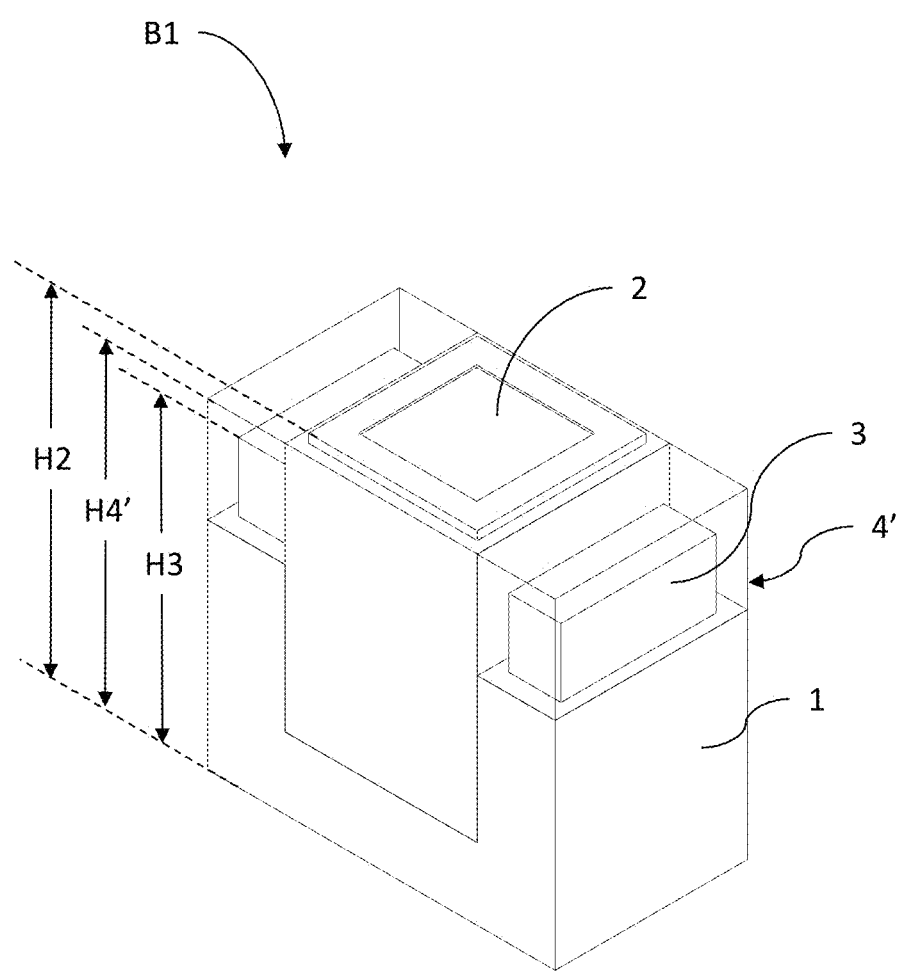
FIG. 5B is a sectional view schematically showing an endoscopic light source-imaging module according to the third embodiment of the present invention.

Refer to FIGS. 5A and 5B for a third embodiment. The third embodiment is different from the first embodiment in that the filling material 42 used by the endoscopic light source-imaging module B1 is a transparent resin material. The filling material 42 is filled into the cavity 100 and cured to form a transparent encapsulation layer 4'. The attitude H4' of the encapsulation resin layer 4' is higher than the height H3 of top surface of the light-emitting element 3. The attitude H4' of the encapsulation resin layer 4' is lower than or equal to the height H2 of the surface of the image sensor 2.

In order to provide fine light source and upgrade image quality, it is preferred: the height H2 of the surface of the image sensor 2 and the height H3 of the top surface of the light-emitting element 3 meet the following equation:

$$|H2-H3| \leq 0.6 \text{ mm}$$

Figure 6:
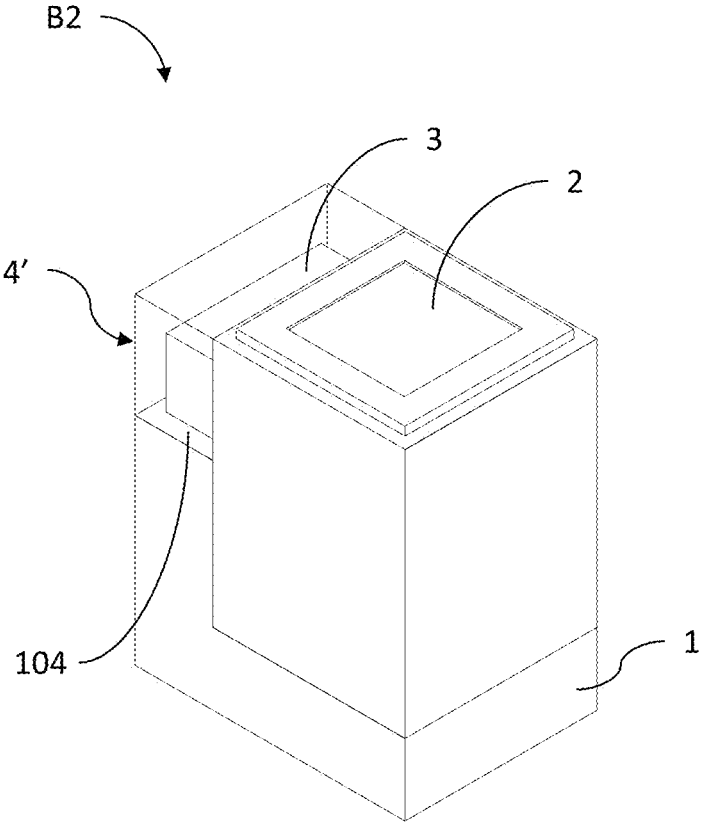
FIG. 6 is a sectional view schematically showing an endoscopic light source-imaging module according to a fourth embodiment of the present invention.

Refer to FIG. 6 for a fourth embodiment. The endoscopic light source-imaging module B2 of FIG. 6 is different from the endoscopic light source-imaging module B1 of FIG. 5B in that the endoscopic light source-imaging module B2 only has a single second surface 104 and a single light-emitting element 3. The single light-emitting element 3 is not disposed on two sides of the image sensor 2 but disposed on the single second surface 104.

Figure 7:
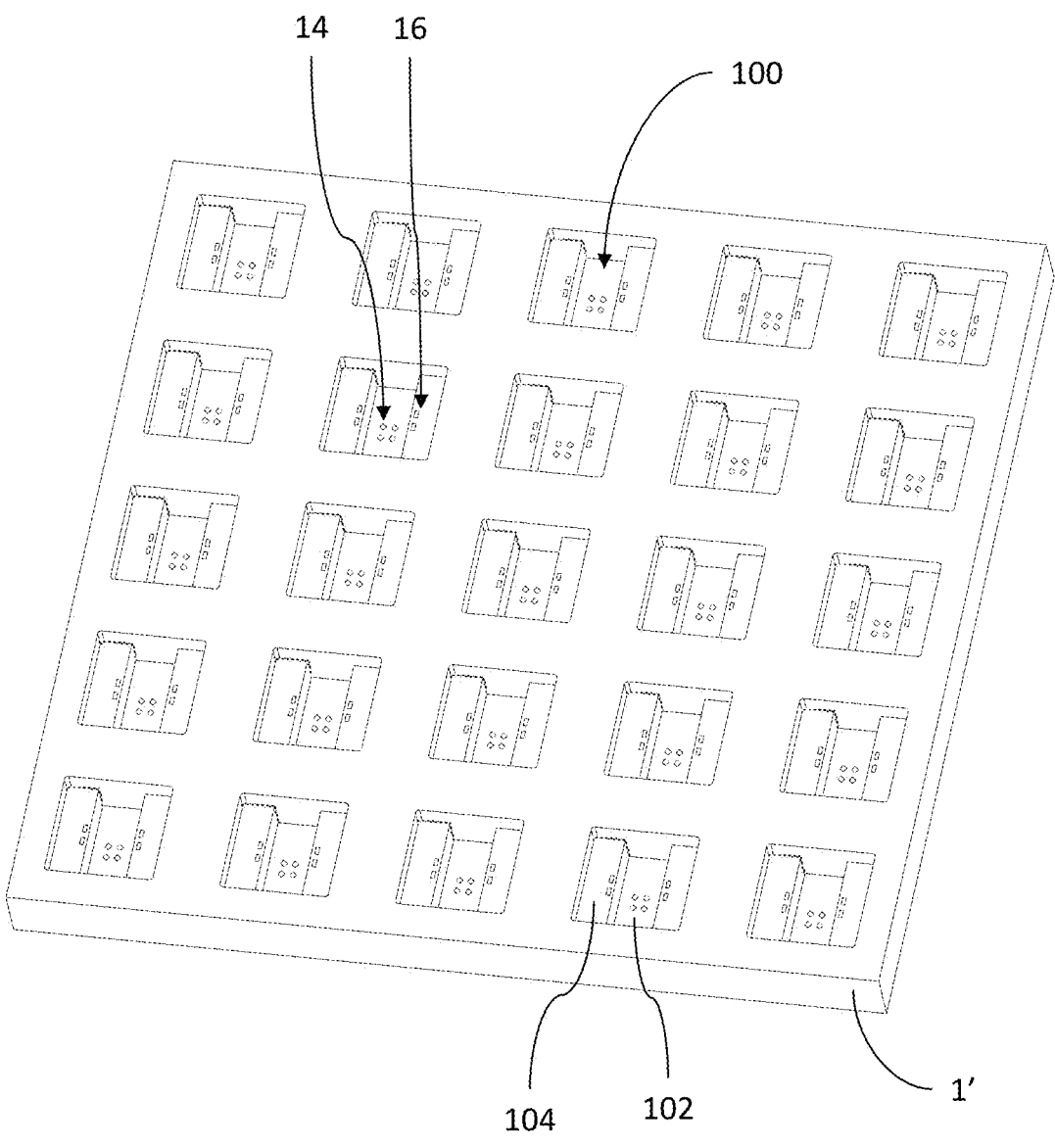
FIG. 7 is a perspective view schematically showing a substrate of an endoscopic light source-imaging module according to a fifth embodiment of the present invention.
Figure 8A:
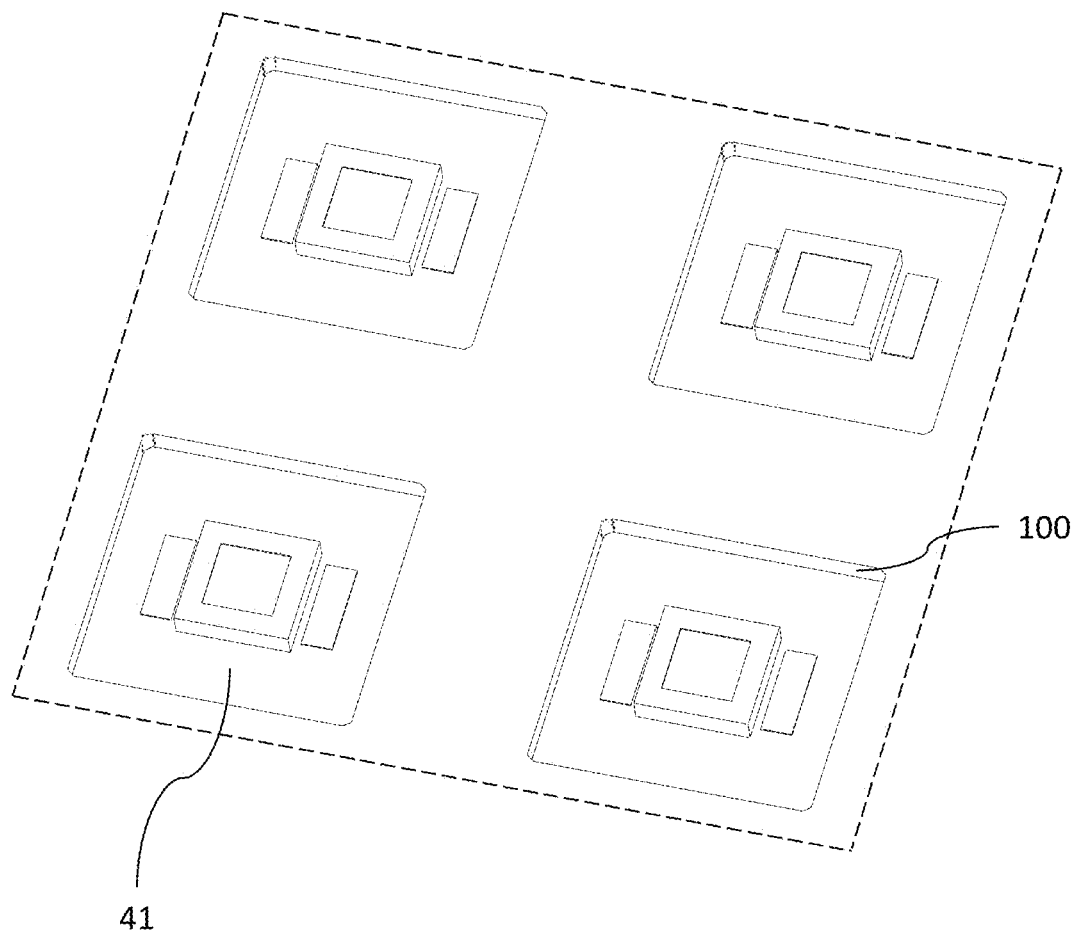
FIG. 8A is a local perspective view schematically showing the endoscopic light source-imaging module where an opaque filling material is filled according to the fifth embodiment of the present invention.
Figure 8B:
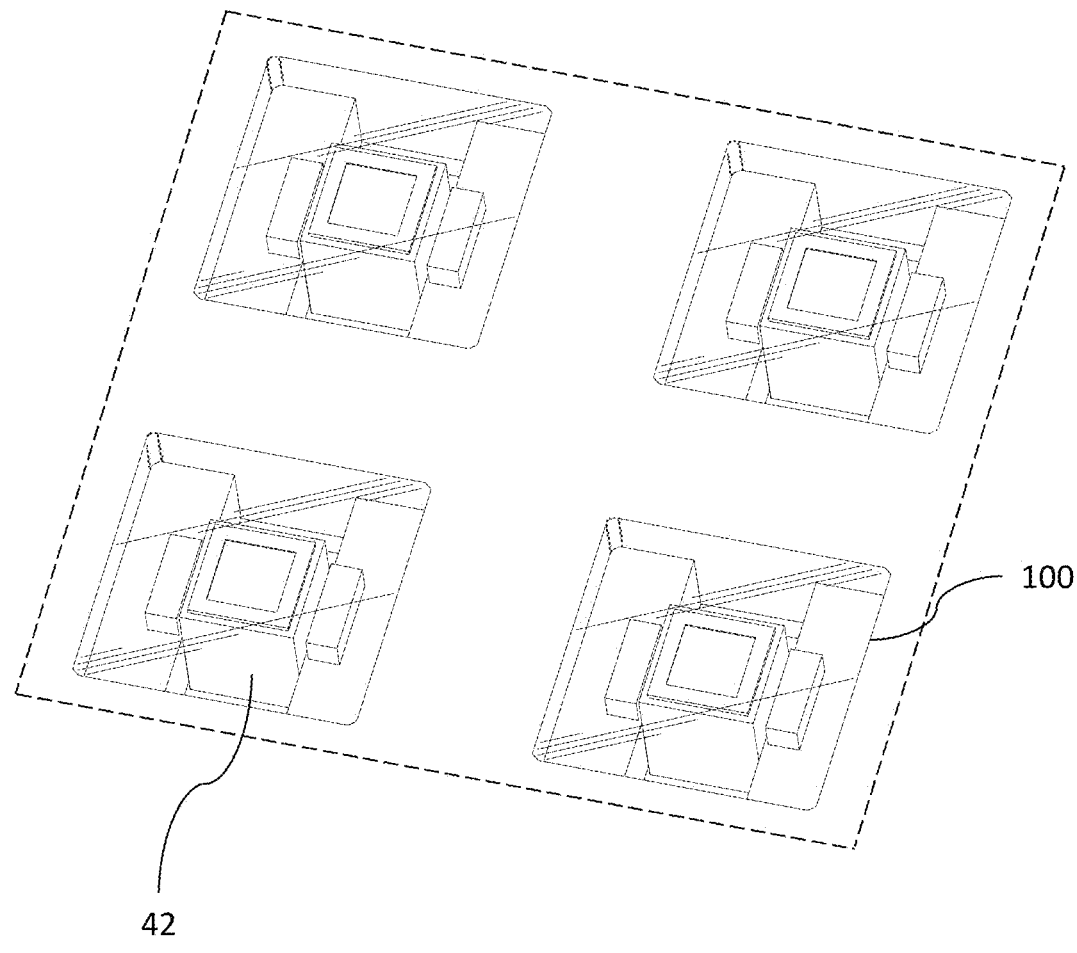
FIG. 8B is a local perspective view schematically showing the endoscopic light source-imaging module where a transparent filling material is filled according to the fifth embodiment of the present invention.
Figure 9:
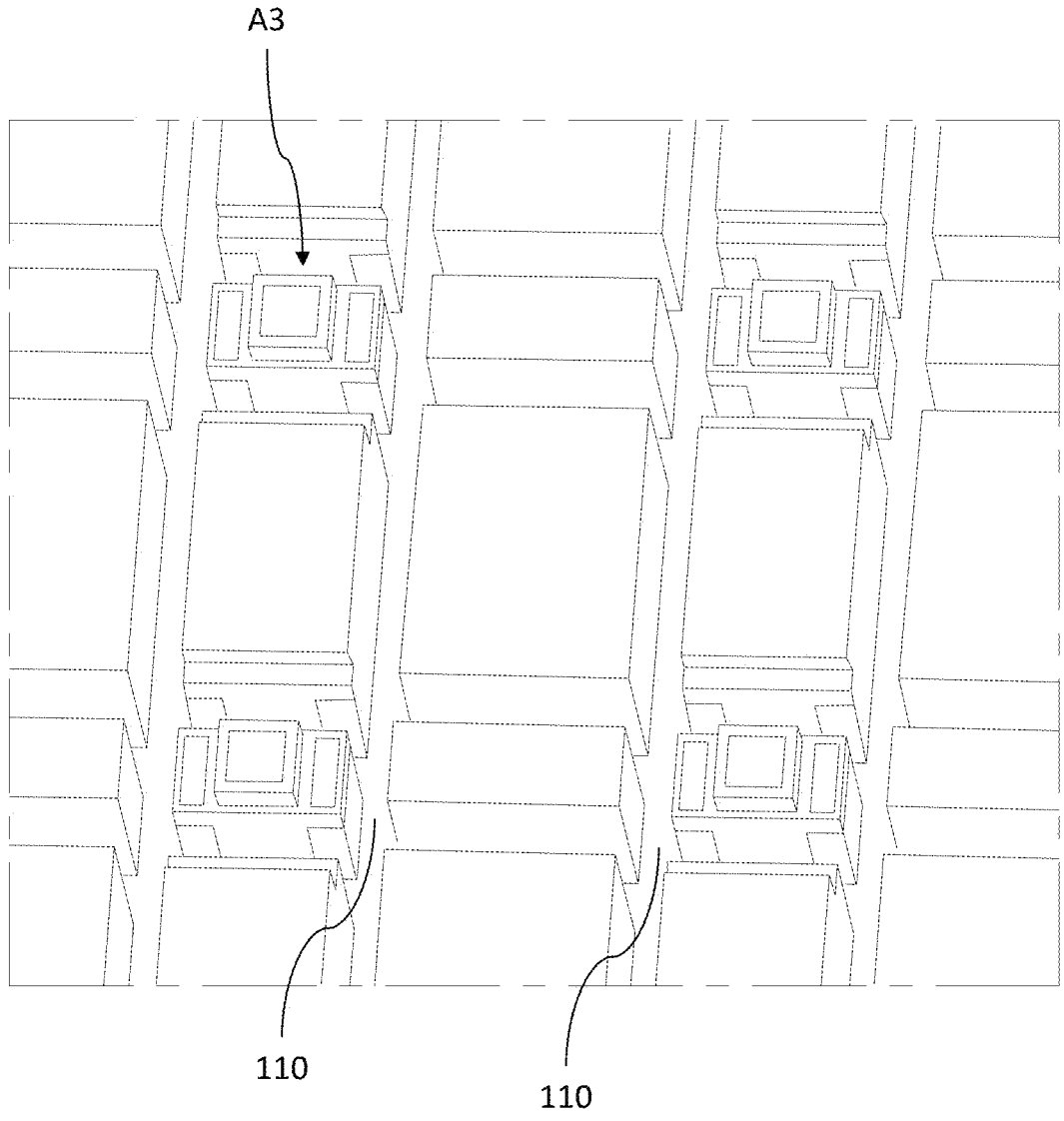
FIG. 9 is a local perspective view schematically that the substrate has been cut according to the fifth embodiment of the present invention.

Refer to FIGS. 7-9 for a fifth embodiment. The fifth embodiment is different from the first embodiment in that the substrate 1' of the fifth embodiment has a plurality of cavities 100 arranged in array. Each of the cavities 100 has a first surface 102, second surfaces 104, a first conductive route 14 and a second conductive route 16.

An opaque filling material 41 (shown in FIG. 8A), a transparent filling material 42 (shown in FIG. 8B), or a combination of the opaque filling material 41 and the transparent filling material 42 may be filled into each of the plurality of cavities 100 of the substrate 1' according to different requirements. The opaque filling material 41 may function as a light shield material to prevent the light source of the light-emitting element 3 from entering the side surfaces of the image sensor 2 and avoid the image quality to be affected. A transparent filling material 42 may be further dispensed on the opaque filling material 41 to cover and protect the light-emitting element 3. However, the transparent filling material 42 is not covered on the image sensor 2 lest the image quality be affected.

In some embodiments, an opaque filling material can be filled into the cavity 100 to cover the first surface 102 and the second surface 104, a layer of transparent filling material can be filled into the cavity 100 to form on the opaque filling material, and the opaque filling material and the transparent filling material are cured to form an encapsulation resin layer. The height of the opaque filling material and the height of the transparent filling material in the cavity 100 can be determined according to different requirements. For instance, the opaque filling material partially covers the light-emitting element 3 and the image sensor 2, but does not cover an upwardly-facing light-emitting surface of the light-emitting element 3 and an upwardly-facing sensing area of the image sensor 2, while the transparent filling material entirety covers the light-emitting element 3 to protect the remaining portion (e.g., the light-emitting surface) that is not covered by the opaque filling material, but partially covers the image sensor 2 to expose the upper portion (e.g., the light-emitting surface) of the image sensor 2. The opaque filling material can be resins (such as Epoxy Resin and Polyester Resin), plastics (such as PVC and Polyethylene), ceramics, or metal fillers. The transparent filling material can also be resins (such as Polyurethane Resin and Acrylic Resin), plastics (such as Polycarbonate and PMMA), ceramics, or metal fillers.

A plurality of cut grooves 110 or scribe lines may be formed on the substrate 1' and between the plurality of cavities. The plurality of cut grooves 110 are used for the cutting process applied to the substrate 1' to form a plurality of endoscopic light-source-imaging modules A3.

Through the abovementioned integral substrate design, the present invention may allocate a plurality of image sensors 2 and a plurality of light-emitting elements 3 on the same substrate 1', whereby to reduce the module size, decrease the fabrication stages, increase productivity, and lower cost. The present invention may allocate the light-emitting elements 3 in different numbers and different positions according to practical requirements. Through cutting the substrate in appropriate grooves, the present invention can provide endoscopic light source-imaging modules respectively having different sizes and different numbers of light-emitting elements to meet different requirements for products.

While the invention is susceptible to various modifications and alternative forms, a specific example thereof has been shown in the drawings and is herein described in detail. It should be understood, however, that the invention is not to be limited to the particular form disclosed, but to the contrary, the invention is to cover all modifications, equivalents, and alternatives falling within the appended claims.

What is claimed is:

1. An endoscopic light source-imaging module comprising: a substrate comprising a top surface, a bottom surface, a first conductive route, and a second conductive route, wherein a cavity is provided on the top surface, the cavity has a first surface and a second surface, the first surface and the second surface neighbor each other and have a preset height drop therebetween, a height of the first surface is less than a height of the second surface, and the height of the second surface is less than a height of the top surface, and the first conductive route and the second conductive route extend from the top surface penetrating through the substrate to the bottom surface; an image sensor disposed on the first surface and electrically connected with the first conductive route; and a light-emitting element disposed on the second surface, neighboring one side of the image sensor, and electrically connected with the second conductive route, wherein a height of a surface of the image sensor is higher than a height of a top surface of the light-emitting element; and a filling material, the filling material is filled into the cavity to cover the first surface and the second surface of the cavity and is cured to form an encapsulation resin layer, wherein the filling material includes an opaque filling material, a transparent filling material, or combinations thereof, and wherein a height of the encapsulation resin layer is configured relative to a height of a top surface of the light emitting element and a height of a surface of the image sensor, wherein, the substrate has a plurality of cut grooves around the cavity, and a light source image module is formed by cutting along a plurality of cutting grooves.

2. The endoscopic light source-imaging module according to claim 1, wherein one end of the first conductive route has a first connection point, and the other end of the first conductive route has a second connection point; the first connection point is disposed on the first surface; the second connection point is disposed on the bottom surface.

3. The endoscopic light source-imaging module according to claim 2, wherein the second connection point is configured for an image signal output point of the image sensor.

4. The endoscopic light source-imaging module according to claim 1, wherein one end of the second conductive route has a third connection point, and the other end of the second conductive route has a fourth connection point; the third connection point is disposed on the second surface; the fourth connection point is disposed on the bottom surface.

5. The endoscopic light source-imaging module according to claim 4, wherein the fourth connection point is connected with an external power source to make the light-emitting element emit light.

6. The endoscopic light source-imaging module according to claim 1, wherein the filling material is an opaque resin material, and a height of the encapsulation resin layer is lower than or equal to a height of a top surface of the light-emitting element.

7. The endoscopic light source-imaging module according to claim 1, wherein the filling material is a transparent resin material, and a height of the encapsulation resin layer is higher than a height of a top surface of the light-emitting element and lower than or equal to a height of a surface of the image sensor.

8. The endoscopic light source-imaging module according to claim 1, wherein the cavity has two second surfaces, and the endoscopic light source-imaging module has two light-emitting elements; the second surfaces are respectively arranged on two sides of the cavity; a region between the second surfaces sinks to form the first surface; the light-emitting elements are respectively arranged on the second surfaces.

9. The endoscopic light source-imaging module according to claim 1, wherein the substrate has a plurality of cavities, which are arranged in array; each of the cavities has the first surface, the second surface, the first conductive route, and the second conductive route.

10. The endoscopic light source-imaging module according to claim 9, wherein the endoscopic light source-imaging module has a plurality of image sensors and a plurality of light-emitting elements; a count of the light-emitting elements is greater than or equal to a count of the image sensors; the plurality of image sensors are respectively disposed on the first surfaces of the plurality of cavities; the plurality of light-emitting elements are respectively disposed on the second surface of the plurality of cavities.

11. The endoscopic light source-imaging module according to claim 1, wherein when the filling material comprises an opaque filling material and a transparent filling material, the opaque filling material being filled within the cavity to cover the first surface and the second surface of the cavity, and the transparent filling material being filled within the cavity and on top of the opaque filling material, and a height of the transparent filling material is higher than a height of the opaque filling material.

12. The endoscopic light source-imaging module according to claim 11, wherein the opaque filling material partially covers the light-emitting element and the image sensor, and the transparent filling material covers a remaining portion of the light-emitting element and partially covers the image sensor.

*   *   *   *   *